(12) United States Patent
Liu

(10) Patent No.: US 7,186,615 B2
(45) Date of Patent: Mar. 6, 2007

(54) METHOD OF FORMING A FLOATING GATE FOR A SPLIT-GATE FLASH MEMORY DEVICE

(75) Inventor: Chia-Chen Liu, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 182 days.

(21) Appl. No.: 10/738,416

(22) Filed: Dec. 17, 2003

(65) Prior Publication Data

US 2005/0136676 A1    Jun. 23, 2005

(51) Int. Cl.
*H01L 21/336* (2006.01)

(52) U.S. Cl. .................... 438/257; 438/258; 438/266; 438/267

(58) Field of Classification Search .............. None
See application file for complete search history.

(56) References Cited

U.S. PATENT DOCUMENTS

| | | | |
|---|---|---|---|
| 6,165,845 A | 12/2000 | Hsieh et al. | 438/260 |
| 6,171,906 B1 | 1/2001 | Hsieh et al. | 438/257 |
| 6,531,734 B1 | 3/2003 | Wu | 257/315 |
| 6,562,681 B2* | 5/2003 | Tuan et al. | 438/257 |
| 6,570,790 B1 | 5/2003 | Harari | 365/185.29 |
| 6,847,068 B2* | 1/2005 | Chuang et al. | 257/260 |
| 2002/0142545 A1* | 10/2002 | Lin | 438/257 |
| 2003/0087493 A1* | 5/2003 | Jenq et al. | 438/265 |
| 2004/0115882 A1* | 6/2004 | Hung et al. | 438/257 |

\* cited by examiner

*Primary Examiner*—Duy-Vu N. Deo

(57) ABSTRACT

A new method to form a floating gate for a flash memory device is achieved. The method comprises forming a gate dielectric layer overlying a substrate. A first conductor layer is deposited overlying the gate dielectric layer. A masking layer is formed overlying the first conductor layer. The masking layer and first conductor layer are etched through. A second conductor layer is deposited overlying the masking layer, the first conductor layer, and the substrate. The second conductor layer is etched down to form spacers on the sidewalls of the first conductor layer and the masking layer. The spacers extend vertically above the top surface of the first conductor layer. The masking layer is etched away to complete said floating gate.

13 Claims, 6 Drawing Sheets

METHOD OF FORMING A FLOATING GATE FOR A SPLIT-GATE FLASH MEMORY DEVICE

BACKGROUND OF THE INVENTION (1) Field of the Invention

The invention relates to a method to manufacture an integrated circuit device, and, more particularly, to a method to form a floating gate for a split-gate flash memory in the manufacture of an integrated circuit device.

(2) Description of the Prior Art

Non-volatile memory devices are widely used in the art of electronics. Non-volatile memories provide stored data to an electronic system in a form that can be retained even during a loss of system power. Non-volatile memory can take the form of one-time programmable devices, such as electrically programmable read-only memory (EPROM), or re-programmable devices, such as electrically erasable, programmable read-only memory (EEPROM). A particular type of EEPROM that is of interest in the present invention is the flash EEPROM. A flash EEPROM provides a means to rapidly erase the EEPROM memory array prior to programming or re-programming.

Referring now to FIG. 6, exemplary flash EEPROM devices 10 are shown in cross sectional representation. A flash device is a MOSFET device where a complex gate is used. The complex gate comprises a floating gate 22a and a control gate 42. The floating gate 22a comprises a first conductor layer 22a overlying the substrate 14 with a gate dielectric layer 18 therebetween. The control gate comprises a second conductor layer 42 in close proximity to the floating gate 22a and with a second dielectric layer 38 lying between the first and second conductor layer 22a and 42. Further, the example devices are split-gate devices. In a split-gate device, the channel region of the substrate 14—the region of the substrate 14 between the drain region 58 and the common source region 62—is controlled by two distinct gate regions. In a first area, the floating gate 22a directly overlies the channel region. In a second area, the control gate 42 directly overlies the channel region.

In the flash device, the memory transistor is turned ON—such that current can conduct from drain 58 to source 62—when the control gate 42 bias is large enough to invert the entire channel region. Note that in the second region, where the control gate directly overlies the channel, the control gate can directly control the channel. However, in the first region, where the floating gate directly overlies the channel region, the biasing action of the control gate is mitigated by the intervening floating gate. As a result, a voltage bias on the control gate is divided across the series capacitance of the floating gate prior to interacting with the channel.

The flash device exhibits two, distinct states: programmed and erased. In the erased state, the floating gate 22a, is devoid of excess electron charge. In the programmed state, the floating gate 22a has a large amount of excess electron charge trapped on the first conductor layer 22a. The presence of excess electron charge on the floating gate increases the effective threshold voltage ($V_{th}$) of the device. That is, a larger gate voltage must be applied to the control gate to turn on the flash device in the programmed (excess electron) state than in the erased state (no excess electrons) state. In the applied circuit, a current sensing mechanism is used to determine the ON-OFF state of the device in the presence of a standard control voltage and a drain-to-source voltage. The determined ON-OFF state is used to "read" the stored data state of the cell as a "0" or a "1". Alternatively, in a multiple-state device, any of several threshold voltages $V_{th}$ may by stored by trapping various, relative amounts of charge on the floating gate 22a.

Programming and erasing of the flash device are accomplished by forcing the control gate 42, drain 58, and source 62 to voltages beyond the ranges used during reading or standby operations. For example, to program the flash device, a positive voltage is forced onto the control gate 42, or word line, of the cell, while the drain 58 is biased to a relatively large voltage and the source 62 is grounded. As a result, electrons will flow from drain to source. However, the high energy of the electrons, due to the large drain 58 bias, will cause some of the electrons to tunnel through the thin, first dielectric 18 and to enter the floating gate electrode 22a. These electrons are then trapped in the floating gate 22a once the programming bias is removed. To erase the device, a large positive voltage is forced on the control gate 42 while the drain 58 and source 62 are grounded. The trapped electrons can tunnel across the second dielectric layer 38 to the control gate 42 and discharge the floating gate 22a.

It is desirable in the art to structure the flash device in such a way as to achieve rapid programming and erasing times while exhibiting very stable and long enduring data retention. The exemplary flash device exhibits two techniques that are used in the art to provide these characteristics. First, the split-gate structure offers a significant advantage over a structure, called a stacked gate, where the control gate 42 directly overlies the floating gate 22a but not the channel. By forming a part of the control gate 42 directly over the channel region of the substrate 14, the split-gate device provides significantly better performance during an over-erase event. In an over-erase event, the floating gate 22a is discharged beyond a neutral condition. As a result, the floating gate 22a actually contains too little electron charge and this causes the $V_{th}$ of the device to fall. If the floating gate 22a is over-erased far enough, then device will become a depletion device where the channel is effectively ON all of the time even in the absence of a positive voltage on the control gate 42. In a stacked gate device, an over-erase condition will cause excessive leakage current that can limit the operating performance of the cell and of the overall array. The split-gate form reduces the over-erase effect because the $V_{th}$ of the device in the channel region directly underlying the control gate 42 is not affected by the over-erase condition. Therefore, the control gate 42 will hold the channel OFF during the standby state and eliminate the leakage current even if the floating gate is over-erased.

A second feature of the exemplary device 10 is the use of lateral floating gate tips 24. Floating gate tips 24 cause a concentration of the electric field between the control gate 42 and the floating gate 22a during an erasing operation. As a result, the floating gate 22a can be erased more completely and more quickly than in a comparable flash device that does not have these tips 24. In this way, the erasing conditions, and especially the control gate voltage, can be made less severe and hazardous to the long-term reliability of the device.

Referring now to FIGS. 1 through 6, an exemplary method of forming lateral, floating gate tips 24 is illustrated. Referring in particular to FIG. 1, the device 10 is again shown in a partially completed, cross sectional representation. A first dielectric layer 18, such as silicon oxide, is formed overlying the substrate 14. A first conductor layer 22, such as polysilicon, is then formed overlying the first dielectric layer 18. A masking layer 26, such as silicon nitride, is formed overlying the first conductor layer 22. The masking layer 26 is then patterned to expose the first conductor layer 22 where the floating gates are planned 30.

Referring now to FIG. 2, the first conductor layer 22 is oxidized to grow a thick layer of thermal oxide 34 overlying and consuming part of the first conductor layer 22. This process is called a local oxidation of silicon, or LOCOS, oxidation and is similar to the approach traditionally used to form field oxide regions. The thermal oxide layer 34 exhibits a well-known shape where the oxide is tapered at the edges of the masking layer 26. Referring now to FIG. 3, the masking layer 26 is then removed. In FIG. 4, the first conductor layer 22 is etched through, using the LOCOS oxide layer 34 as a mask, to form the floating gate electrodes 22a. Note how the tapered cross-section of the LOCOS oxide layer 34 creates the lateral tips 24 on the first conductor layer 22a of each floating gate. Referring now to FIG. 5, the second dielectric layer 38 and second conductor layer 42 are formed to create the control gates 42 for each cell. Referring again to FIG. 6, subsequent process steps may include forming the source 62 and drain 58 regions by ion implantation, forming sidewall spacers 54, forming silicide 46 to reduce gate resistivity, and capping 50 the complex gates.

The above-described method of formation results in a useful, split-gate device having a vertically tipped, floating gate. However, it is found that the LOCOS oxide hard mask 34 creates a difficult to control floating gate etch process. As a result of poor process control, some devices exhibit a "weak erase" condition where the floating gate is not adequately erased by the standard erase procedure. Achieving an improved method to form a tipped floating gate, split-gate flash device is therefore a desirable outcome of the present invention.

Several prior art inventions relate to flash memory devices and methods of manufacture. U.S. Pat. No. 6,570,790 B1 to Harari describes several EPROM and flash EEPROM devices showing alternative floating gate shapes. Lateral tips on floating gates are shown. U.S. Pat. No. 6,531,734 B1 to Wu discloses a split-gate flash memory device and method of manufacture. U.S. Pat. No. 6,171,906 B1 to Hsieh et al discloses a split-gate flash device and method of manufacture showing a floating gate with an erasing tip formed using LOCOS. U.S. Pat. No. 6,165,845 to Hsieh et al describes a split-gate flash device and method of manufacture. An angled etch is used to create an angled floating gate prior to using LOCOS to form the floating gate tips.

SUMMARY OF THE INVENTION

A principal object of the present invention is to provide an effective and very manufacturable floating gate for a flash memory device.

A further object of the present invention is to provide a method to form a floating gate having vertical tips to improve erasing performance.

A yet further object of the present invention is to provide a method to form a floating gate that does not compromise programming, erasing, or data retention.

A yet further object of the present invention is to provide a method to form a flash memory device.

A yet further object of the present invention is to provide a method to form a split-gate flash memory device.

Another further object of the present invention is to provide a floating gate with a preferred topology.

Another further object of the present invention is to provide a flash device having a floating gate with a preferred topology.

In accordance with the objects of the present invention, a method to form a floating gate for a flash memory device is achieved. The method comprises forming a gate dielectric layer overlying a substrate. A first conductor layer is deposited overlying the gate dielectric layer. A masking layer is formed overlying the first conductor layer. The masking layer and first conductor layer are etched through. A second conductor layer is deposited overlying the masking layer, the first conductor layer, and the substrate. The second conductor layer is etched down to form spacers on the sidewalls of the first conductor layer and the masking layer. The spacers extend vertically above the top surface of the first conductor layer. The masking layer is etched away by wet etch to avoid spacer tip damage to complete said floating gate.

Also in accordance with the objects of the present invention, a method to form a flash memory device is achieved. The method comprises forming a gate dielectric layer overlying a substrate. A first conductor layer is deposited overlying the gate dielectric layer. A masking layer is deposited overlying the first conductor layer. The masking layer and the first conductor layer are etched through. A second conductor layer is deposited overlying the masking layer, the first conductor layer, and the substrate. The second conductor layer is etched down to form spacers on the sidewalls of the first conductor layer and the masking layer. The spacers extend vertically above the top surface of the first conductor layer. The masking layer is etched away is etched away by wet etch to avoid spacer tip damage to complete the floating gate. A second dielectric layer is formed overlying the floating gate and the substrate. A third conductor layer is formed overlying the second dielectric layer. The third conductor layer is patterned to form a control gate overlying the floating gate.

Also in accordance with the objects of the present invention, a flash memory device is achieved. The device comprises a substrate. A floating gate overlies the substrate. The floating gate comprises a first conductor layer overlying a dielectric layer and spacers adjacent to and contacting the first conductor layer. The spacers comprise a second conductor layer. The spacers extend vertically above the first conductor layer. A control gate overlies the floating gate. The control gate comprises a third conductor layer overlying the floating gate with a second dielectric therebetween.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a method to form a floating gate having vertical tips to improve erasing performance. A method to form a flash EEPROM memory device incorporating an improved floating gate is disclosed. It should be clear to those experienced in the art that the present invention can be applied and extended without deviating from the scope of the present invention.

Figure 1:
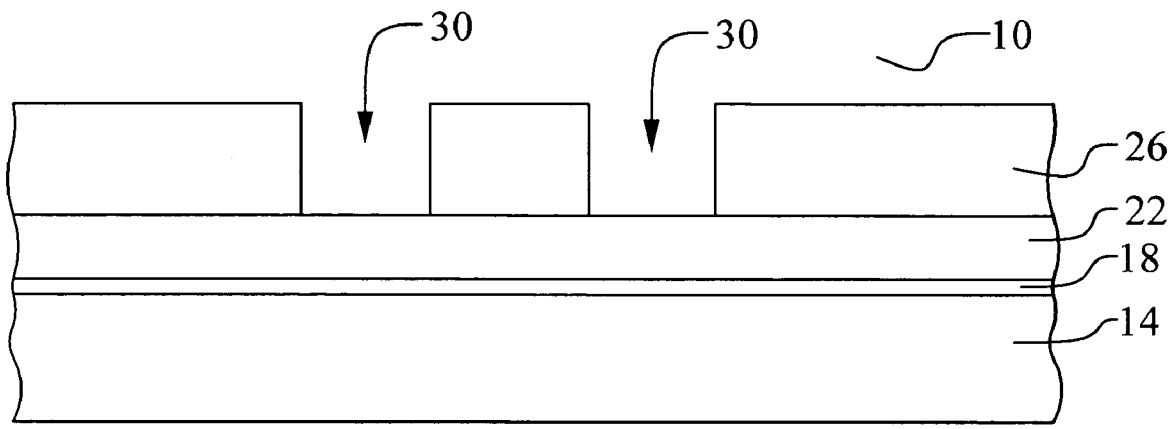
FIGS. 1 though 6 illustrate a prior art, flash EEPROM memory device and method of formation.
Figure 2:
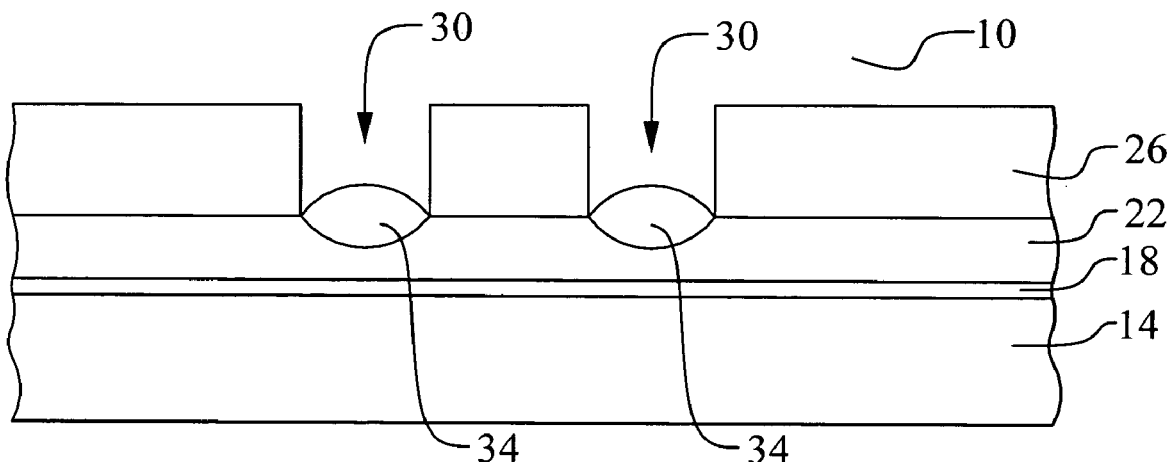
Figure 3:
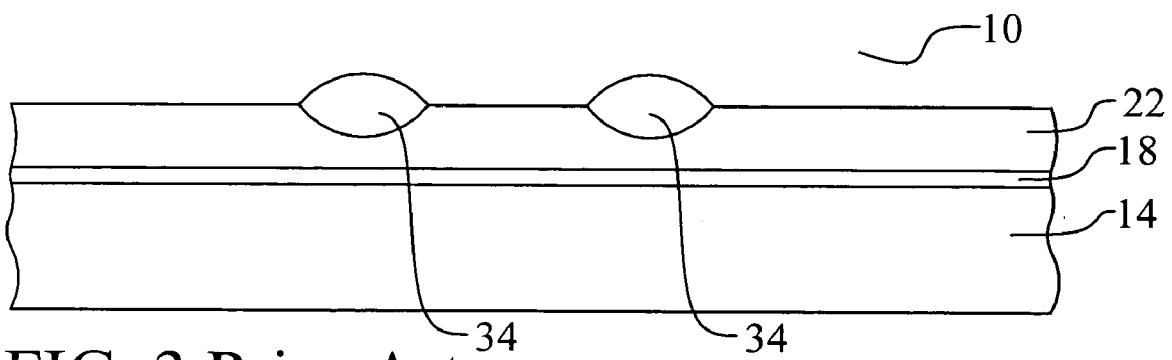
Figure 4:
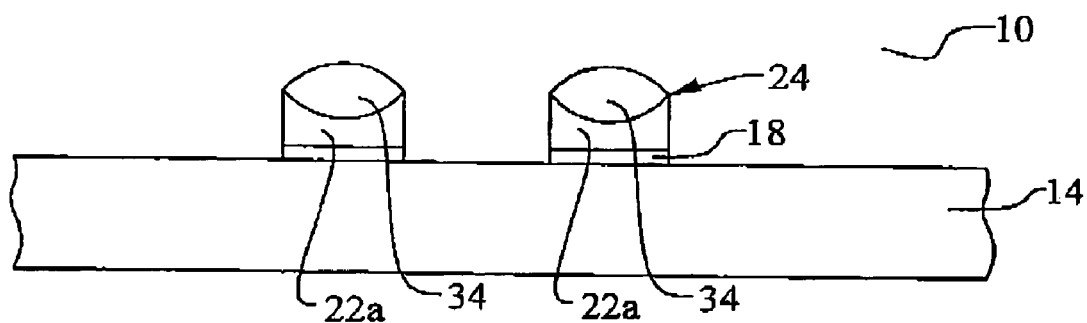
Figure 5:
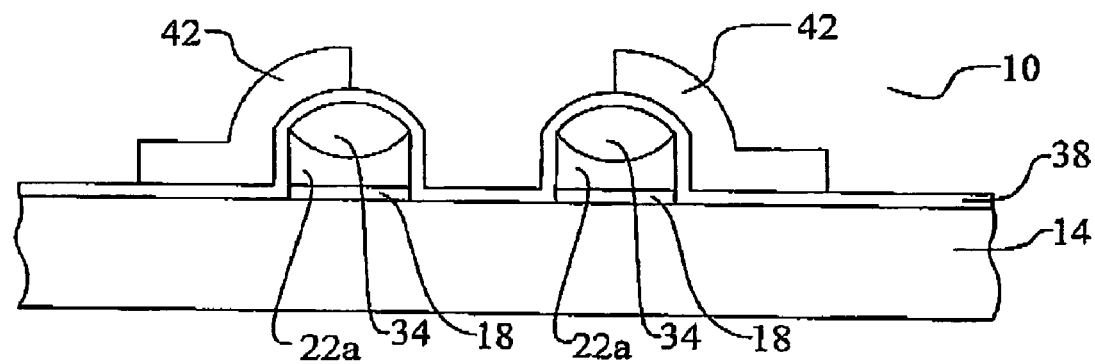
Figure 6:
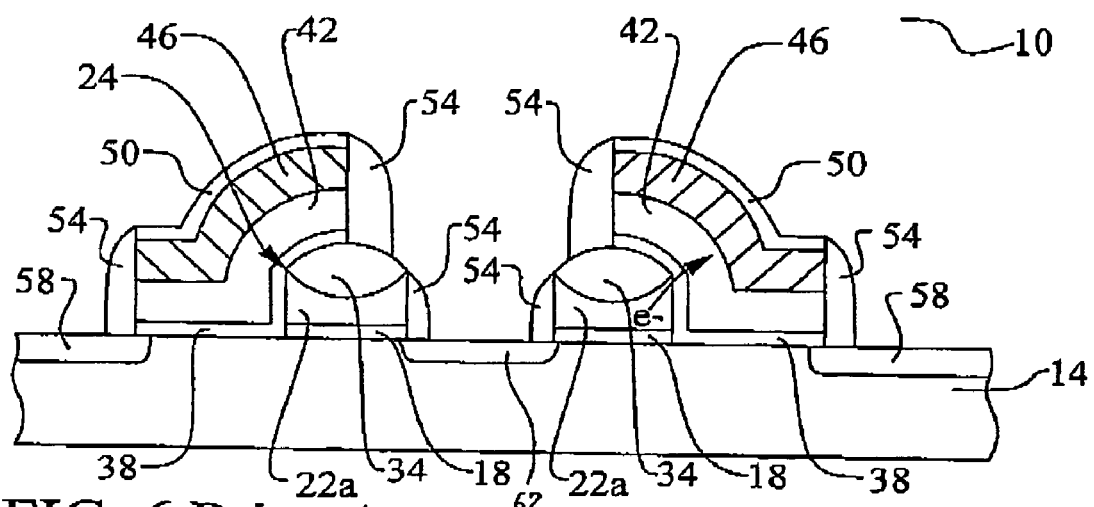
Figure 7:
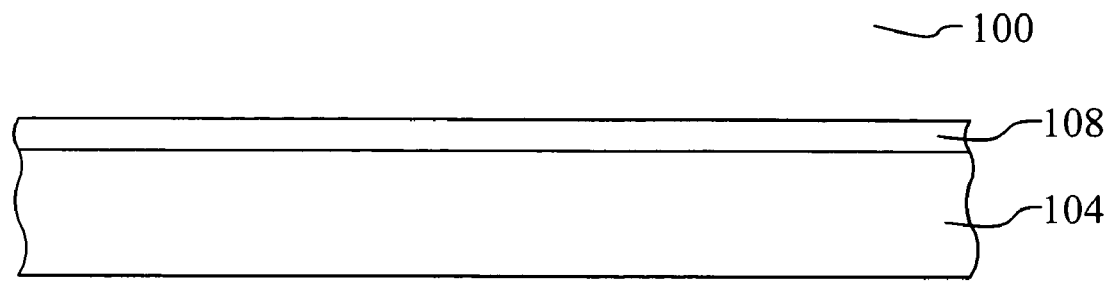
FIGS. 7 through 16 illustrate a preferred embodiment of the present invention.

Referring now to FIGS. 7 through 16, a preferred embodiment of the present invention is illustrated. Several important features of the present invention are shown and discussed below. In the preferred embodiment, a flash memory device is formed. Referring now particularly to FIG. 7, a cross-section of a partially complete flash memory device 100 is shown. A substrate 104 is provided. The substrate 104 preferably comprises a semiconductor material and, more preferably, comprises monocrystalline silicon. Silicon, if used, can have any of the typical crystal orientations as are well known in the art. Further, the substrate may be doped or undoped with impurity ions as is also well known in the art. Preferably, the substrate 104 comprises silicon that is lightly doped to either n-type or p-type. In addition, the substrate 104 may comprise additional layers such as in the case of a silicon on oxide (SOI) substrate.

As an important feature, a gate dielectric layer is formed for the planned floating gate. As a preferred embodiment, the gate dielectric layer is formed in a novel method that allows the formation of a dielectric layer having two thicknesses. Returning to FIG. 7, a first dielectric layer 108 is formed overlying the substrate 104. The first dielectric layer 108 preferably comprises oxide and, more preferably, comprises silicon oxide. The first dielectric layer 108 may be formed by thermal oxidation of the substrate 104 or by a chemical vapor deposition (CVD) process. Preferably, the first dielectric layer 108 is formed, by thermal oxidation of the substrate 104, to a thickness of between about 200 Å and about 400 Å.

Figure 8:
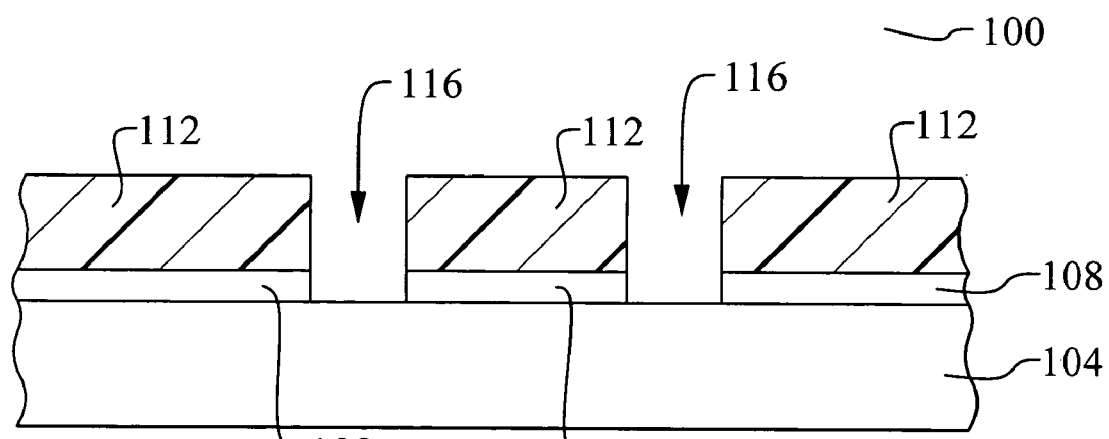

Referring now to FIG. 8, as an important feature, the first dielectric layer 108 is patterned to remove the first dielectric layer 108 from areas 116 where the floating gates are planned. The patterning step preferably comprises a photolithographic definition and etch sequence. For example, a photoresist layer 112 is deposited overlying the first dielectric layer 108. The photoresist layer 112 is exposed to actinic light through a pattern-bearing mask. The photoresist layer 112 is then developed to remove parts of the photoresist 112 that are either cross-linked or not cross-linked, depending on the photoresist type. A patterned photoresist layer 112 is thereby created that is a transferred image, either positive or negative, of the mask. An etch step is then performed to remove the first dielectric layer 108 where it is exposed by the photoresist layer 112. This etch step may comprise a dry etch or a wet etch as is known in the art. The photoresist layer 112 is then stripped away.

Figure 9:
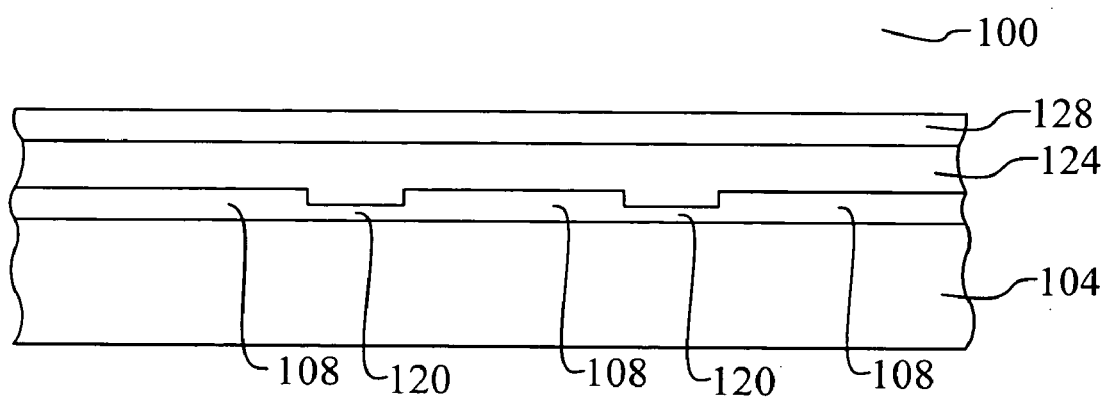

Referring now to FIG. 9, a gate dielectric layer 120 is formed overlying the substrate 104 where the first dielectric layer 108 was removed. Preferably, the gate dielectric layer 120 is substantially thinner than the first dielectric layer 108. The gate dielectric layer 120 may be formed by thermal oxidation of the substrate 104 or by a CVD process. Preferably, the gate dielectric layer 120 is formed by the thermal oxidation of the silicon substrate 104 and to a thickness of between about 80 Å and about 90 Å. By this method, two dielectric layers, the first dielectric layer 108 and the gate dielectric layer 120, are formed having two substantially different thicknesses. The very thin, gate dielectric layer 120 serves as the tunneling oxide underlying the lateral portion of the planned floating gate. The thicker, first dielectric layer 108 serves as the dielectric underlying the novel, floating gate spacers of the planned floating gate, to prevent gate dielectric layer 120 becoming damaged during the pre dip step for deposition of the second conductor layer 136.

Alternatively, a single thickness gate dielectric layer 120 could simply be formed overlying the entire substrate 104. In this case, the steps illustrated by FIGS. 7 and 8 would be skipped and a conformal gate dielectric layer 120 would be thermally grown overlying the substrate 104.

Referring again to FIG. 9, as another important feature a first conductor layer 124 is deposited overlying the first dielectric layer 108 and the gate dielectric layer 120. The first conductor layer 124 will be used to form the lateral part of the floating gate electrode in subsequent process steps. The first conductor layer 124 preferably comprises polysilicon but may comprise other conductive materials such as are known in the art. More preferably, the first conductor layer 124 comprises polysilicon that is deposited by a CVD or a low pressure CVD process and to a thickness of between about 500 Å and about 1,000 Å. If polysilicon is used for the first conductor layer 124, this polysilicon may be doped or undoped and, if doped, the doping may be performed insitu with the deposition or by a later ion implantation.

As another important feature, a masking layer 128 is deposited overlying the first conductor layer 124. The masking layer 128 is used to define the position and the height of the subsequently formed floating gate spacers. The masking layer 128 comprises a material differing from the first conductor layer 124 such that each layer may be etched or removed independently. Preferably, the masking layer 128 comprises silicon nitride. Alternatively, silicon oxide could be used for the masking layer 128. The masking layer 128, if silicon nitride, is preferably deposited by CVD or low pressure CVD to a thickness of between about 300 Å and about 700 Å. As will be demonstrated below, the thickness of the deposited masking layer 128 substantially establishes the height of the novel floating gate spacers that will be formed in the subsequent process steps.

Figure 10:
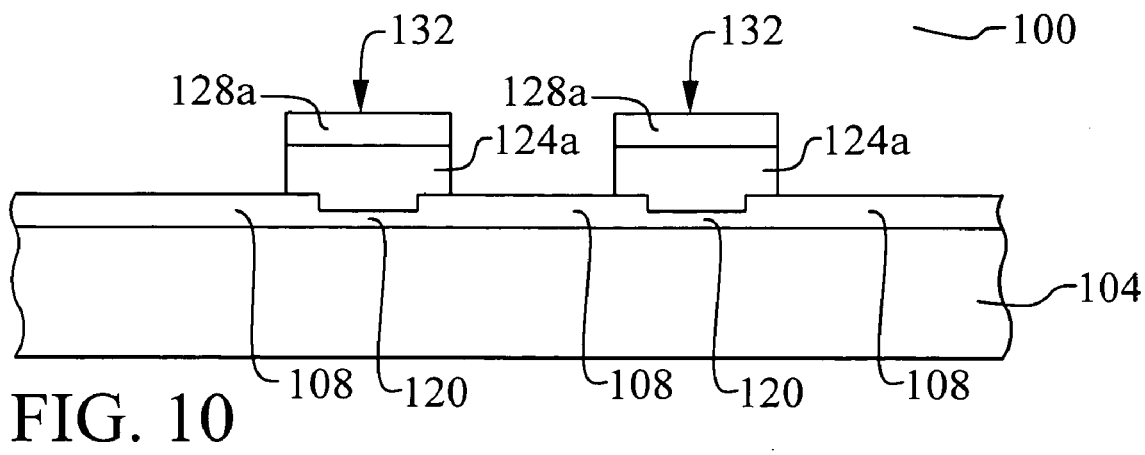

Referring now to FIG. 10, another important step in the preferred embodiment of the present invention is illustrated. The masking layer 128 and the first conductor layer 124 are patterned. This patterning step preferably comprises some type of photolithography and etch sequence as described above. The masking layer 128 may first be patterned, or etched, using a patterned photoresist layer, not shown. Then the first conductor layer 124 may be patterned using the masking layer 128 as a mask. Alternatively, both the masking layer 128 and the first conductor layer 124 may be patterned using a patterned photoresist layer, not shown, as a mask. The patterning step may comprise dry or wet etching as is well known the art. Preferably, a dry, plasma, or reactive ion etch is used to define the masking layer 128 and the first conductor layer 124. As a result, the masking layer 128a and the first conductor layer 124a are left overlying the gate dielectric layer 120. Preferably, the masking layer 128a and the first conductor layer 124a are defined so that these layers overlap, or are made larger than, the gate dielectric layer 120 as shown. The resulting first conductor layer 124a corresponds to the lateral portions of the planned floating gates 132.

Figure 11:
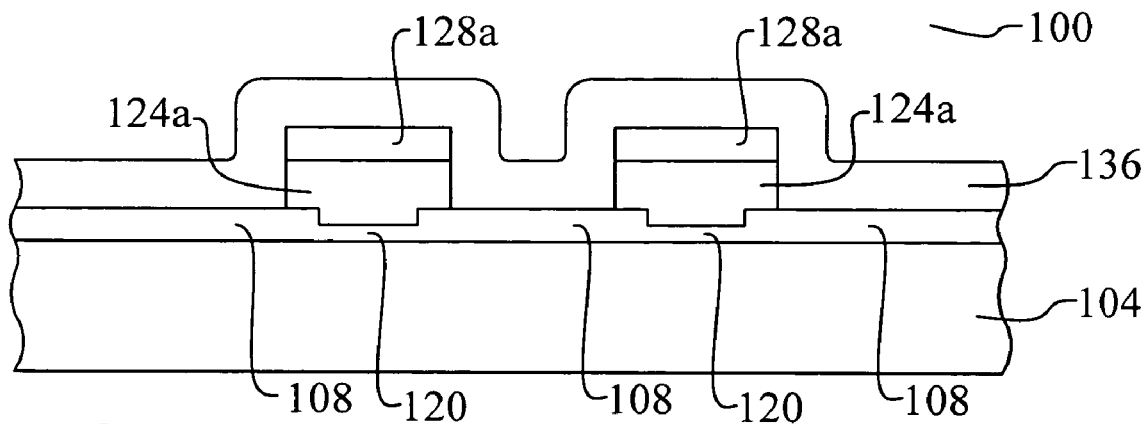

Referring now to FIG. 11, another important feature of the present invention is illustrated. A second conductor layer 136 is deposited overlying the masking layer 128a, the first conductor layer 124a, and the first dielectric layer 108. The second conductor layer 136 is used to form the novel, floating gate spacers as will be demonstrated. The second conductor layer 136 preferably comprises polysilicon but may comprise other conductive materials such as are known in the art. More preferably, the second conductor layer 136 comprises polysilicon that is deposited by a CVD or a low pressure CVD process and to a thickness of between about 800 Å and about 1,200 Å. If polysilicon is used for the second conductor layer 136, this polysilicon may be doped or undoped and, if doped, the doping may be performed insitu with the deposition or by a later ion implantation.

Figure 12:
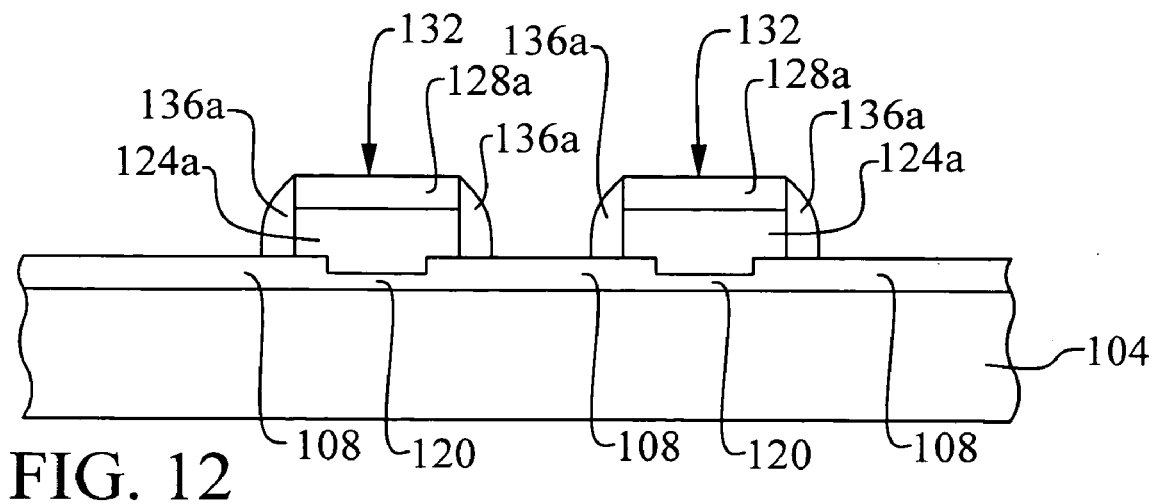

Referring now to FIG. 12, a very important feature of the present invention is illustrated. The second conductor layer 136 is etched down to create spacers 136a on the sidewalls of the masking layer 128a and the first conductor layer 124a. The second conductor layer 136a is etched down using an anisotropic etching process that removes the second conductor layer 136a primarily in the vertical direction. Preferably, the etching process comprises a dry, plasma, or reactive ion etch. The etching process is stopped once the masking layer 128a. The resulting spacers 136a contact the first conductor layer 124a and extend vertically above the first conductor layer 124a as shown. The curved or sloping shape of the spacers 136a is typical of an etch back formed spacer. The spacers 136a stop at about the top edge of the masking layer 128a.

Figure 13:
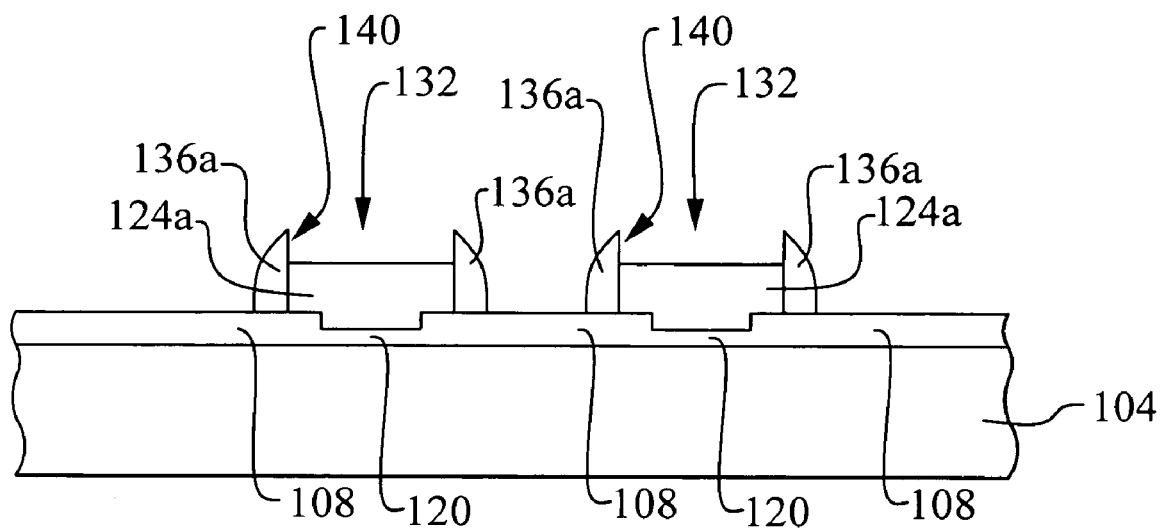

Referring now to FIG. 13, another very important part of the present invention is illustrated. The masking layer 128a is removed by wet etch to complete the floating gates 132 and the wet etch will not damage spacer tip. The masking layer 128a may be removed by a dry, plasma, or reactive ion etch or by a wet etch. Once the masking layer 128a is removed, the vertical tips 140 of the remaining floating gates 132 are seen. The floating gates 132 can be seen to comprise a lateral portion comprising the patterned first conductor layer 124a and vertical spacers comprising the etched back second conductor layer 136a. The spacers 136a vertically extend above the top surface of the lateral portions 124a. The spacers 136a exhibit tips 140 that are useful for improving the erasing performance of flash EEPROM devices that are formed using the floating gates 132.

Figure 14:
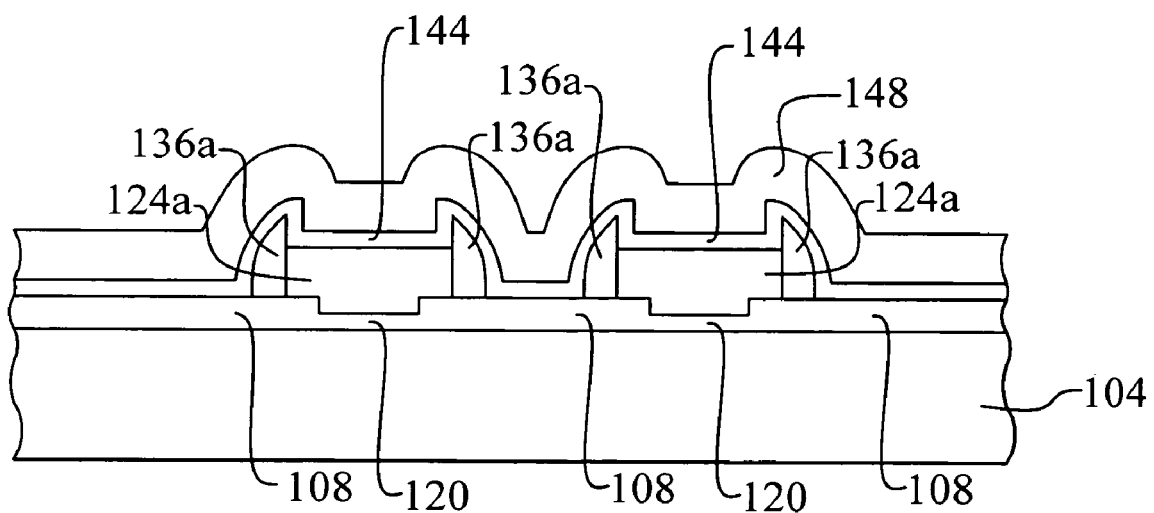
Figure 15:
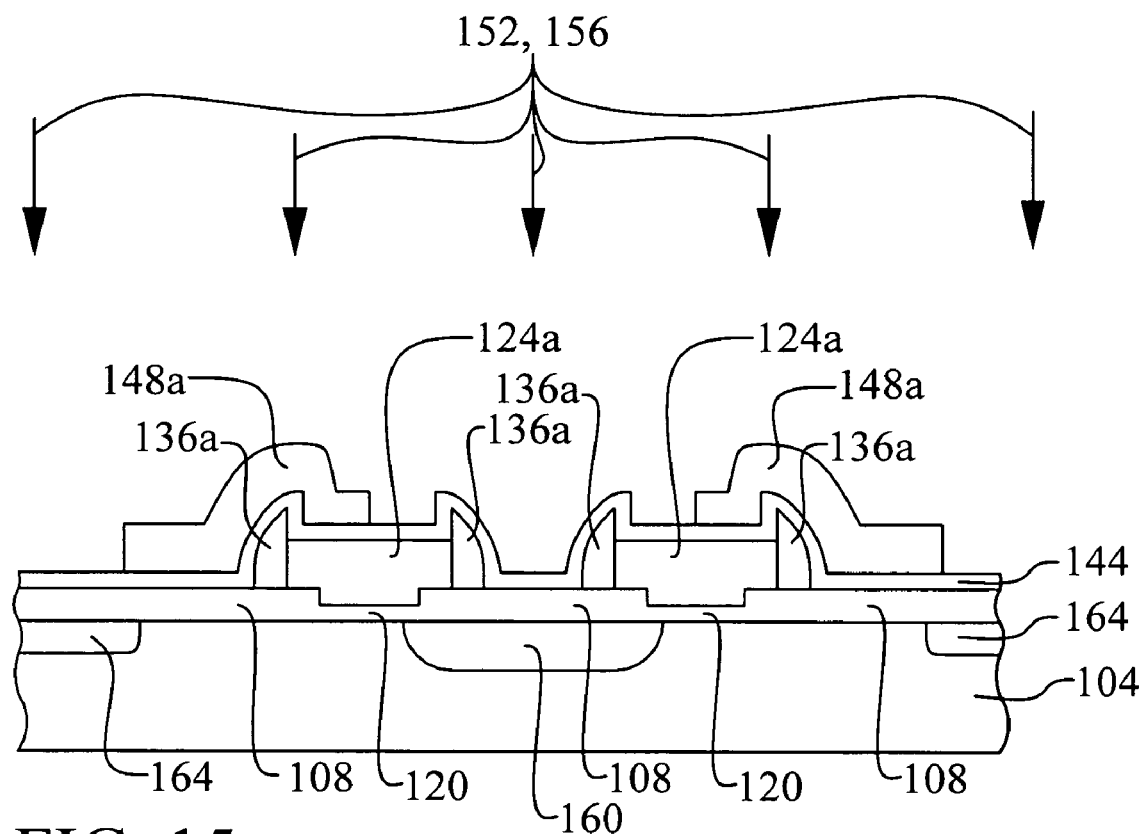
Figure 16:
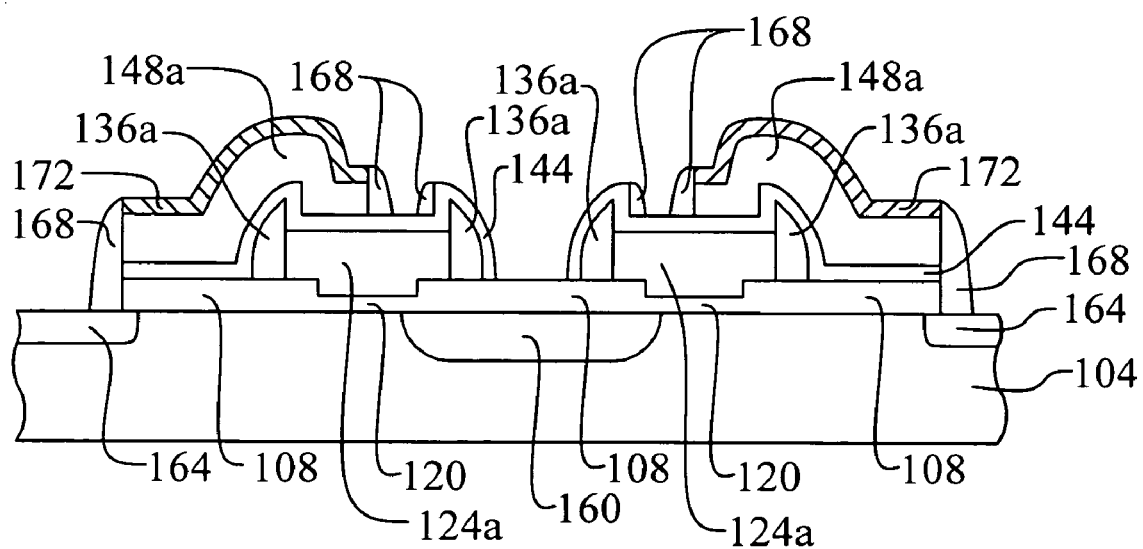

Referring now to FIGS. 14 through 16, the novel floating gates of the present invention are further applied to the formation of split-gate flash EEPROM devices using an exemplary and preferred method. Referring particularly to FIG. 14, a second dielectric layer 144 is formed overlying the floating gates 136a and 124a and the first dielectric layer 108. The second dielectric layer 144 forms the inter-gate dielectric between the floating gates 136a and 124a and the subsequently formed control gates. In addition, the second dielectric layer 144 forms part of the dielectric layer stack overlying the planned channel region of split-gate device. The second dielectric layer 144 preferably comprises oxide and, more preferably, comprises silicon oxide. Other dielectrics, such as nitride, oxynitride, and metal oxides, could be used. The second dielectric layer, if silicon oxide, is preferably formed by a CVD process to a thickness of between about 150 Å and about 250 Å.

A third conductor layer 148 is deposited overlying the second dielectric layer 144. The third conductor layer 148 is used to form the control gates, or word lines gates, of the planned flash EEPROM devices. The third conductor layer 148 preferably comprises polysilicon but may comprise other conductive materials such as are known in the art. More preferably, the third conductor layer 148 comprises polysilicon that is deposited by a CVD or a low pressure CVD process to a thickness of between about 1,000 Å and about 3,000 Å. If polysilicon is used for the third conductor layer 148, this polysilicon may be doped or undoped and, if doped, the doping may be performed insitu with the deposition or by a later ion implantation.

Referring now to FIG. 15, other important steps in completion of flash EEPROM devices in the present invention are illustrated. The third conductor layer 148 is patterned to form control gates 148a as shown. A patterned photoresist layer, not shown, may be formed and used to mask the third conductor layer 148 etch. Ions may be implanted 152 and 156 into the substrate 104 to form drain regions 164 and source regions 160 for the flash devices. In the exemplary arrangement, sources 160 are shared between two, split-gate flash transistors on the floating gate side. Drains 164 are formed on the control gate side of the split-gate transistors. Separate ion implantation steps 152 and 156 may be used to create drain regions 164 and source regions 160 having different depth or concentration profiles as shown.

Referring now to FIG. 16, the flash EEPROM device of the present invention is completed. Secondary spacers 168 may be created by depositing a fourth dielectric layer 168 and etching this layer 168 back. Self-aligned silicide (salicide) 172 may then be formed either on the control gates 148a, as shown, or on the drain and source regions 164 and 160, or on both, as is well known in the art.

The resulting split-gate flash EEPROM devices exhibit improved erasing performance due to the presence of the vertical tips on the spacers 136a of the floating gates. In addition, the method of formation does not require etching the polysilicon gate, as defined by a LOCOS mask, as is done in the prior art. As a result, the lateral regions 124a and vertical regions 136a of the floating gates are very manufacturable and provide predictable programming, erasing, and data retention performance. The use of two dielectric layers 108 and 120 under the floating gates 136a and 124a allows for optimization of the erasing performance through the spacer tip 136a to control gate 148a interface and the programming performance at the gate dielectric layer 120 to lateral floating gate 124a interface.

The advantages of the present invention may now be summarized. An effective and very manufacturable floating gate for a flash memory device is achieved. A method to form a floating gate having vertical tips to improve erasing performance is achieved. The resulting floating gate does not compromise programming, erasing, or data retention. Further, a method to form a flash memory device is achieved and applied to a split-gate flash memory device. A floating gate with a preferred topology is achieved and applied to a split-gate flash EEPROM device.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method to form a floating gate for a flash memory device, said method comprising:

forming a dielectric layer over a substrate;

removing a portion of said dielectric layer to define an area where said floating gate is to be formed;

forming a floating gate dielectric layer overlying said area where said floating gate is to be formed, wherein a remaining portion of said dielectric layer serves as a control gate dielectric layer and said floating gate dielectric layer overlying said area where said floating gate is to be formed serves as a tunneling layer;

forming a conductor layer overlying said floating gate dielectric layer, thereby forming said floating gate;

forming a masking layer overlying said conductor layer;

forming conductive spacers on the sidewalls of said conductor layer and said masking layer, and over a portion of said dielectric layer, wherein said spacers extend vertically above the top surface of said conductor layer; and removing said masking layer.

2. The method according to claim 1 wherein said dielectric layer is formed by thermal oxidation of said substrate.

3. The method according to claim 2 wherein said floating gate dielectric layer is formed by thermal oxidation of said substrate.

4. The method according to claim 1 wherein said conductor layer and said conductive spacers comprise polysilicon.

5. The method according to claim 1 further comprising the steps of:
   forming another dielectric layer overlying said floating gate and said substrate;
   forming another conductor layer overlying said another dielectric layer; and
   patterning said another conductor layer to form a control gate overlying said floating gate.

6. The method according to claim 5 wherein part of said control gate overlies said control gate dielectric layer.

7. The method according to claim 6 further comprising implanting ions into said substrate to form doped regions adjacent to said control gate and to said floating gate.

8. A method to form a flash memory device, said method comprising:
   forming a first dielectric layer over a substrate;
   removing a portion of said first dielectric layer to define an area where a floating gate is to be formed;
   forming a floating gate dielectric layer overlying said area where said floating gate is to be fanned, wherein a remaining portion of said first dielectric layer serves as a control gate dielectric layer, and said floating gate dielectric layer overlying said area where said floating gate is to be fanned serves as a tunneling layer;
   forming a first conductor layer overlying said floating gate dielectric layer;
   forming a masking layer overlying said first conductor layer;
   patterning said masking layer and said first conductor layer, thereby forming said floating gate;
   thereafter forming a second conductor layer overlying said masking layer, said first conductor layer, and said substrate;
   patterning said second conductor layer to form spacers on said sidewalls of said first conductor layer and said masking layer, and over a portion of said dielectric layer, wherein said spacers extend vertically above the top surface of said first conductor layer;
   removing said masking layer;
   forming a second dielectric layer overlying said floating gate and said substrate;
   forming a third conductor layer overlying said second dielectric layer; and
   patterning said third conductor layer to form a control gate overlying said floating gate.

9. The method according to claim 8 wherein said first dielectric layer is formed by thermal oxidation of said substrate.

10. The method according to claim 9 wherein said floating gate dielectric layer is formed by thermal oxidation of said substrate.

11. The method according to claim 8 wherein said first and second conductor layers comprise polysilicon.

12. The method according to claim 8 wherein part of said control gate overlies said control gate dielectric layer.

13. The method according to claim 12 further comprising implanting ions into said substrate to form doped regions adjacent to said control gate and to said floating gate.

* * * * *

UNITED STATES PATENT AND TRADEMARK OFFICE
CERTIFICATE OF CORRECTION

PATENT NO.         : 7,186,615 B2                                               Page 1 of 1
APPLICATION NO.    : 10/738416
DATED              : March 6, 2007
INVENTOR(S)        : Chia-Chen Liu It is certified that error appears in the above-identified patent and that said Letters Patent is hereby corrected as shown below:

Column 9, line 28, delete "fanned" and insert therefore -- formed --.

Column 9, line 32, delete "fanned" and insert therefore -- formed --.

Signed and Sealed this

Thirty-first Day of July, 2007

JON W. DUDAS
*Director of the United States Patent and Trademark Office*